(12) United States Patent
Nakanishi

(10) Patent No.: US 7,950,140 B2
(45) Date of Patent: May 31, 2011

(54) CONNECTION DEVICE FOR ELECTRIC COMPONENTS

(75) Inventor: Tomoaki Nakanishi, Saga (JP)

(73) Assignee: Panasonic Corporation, Osaka (JP)

( * ) Notice: Subject to any disclaimer, the term of this patent is extended or adjusted under 35 U.S.C. 154(b) by 165 days.

(21) Appl. No.: 12/026,083

(22) Filed: Feb. 5, 2008

(65) Prior Publication Data

US 2008/0295321 A1 Dec. 4, 2008

(30) Foreign Application Priority Data

Feb. 6, 2007 (JP) .................................. 2007-026739

(51) Int. Cl.
*B23P 19/00* (2006.01)
(52) U.S. Cl. ................ 29/743; 29/739; 29/740; 29/832; 29/833; 294/64.1; 294/65; 269/21; 269/903
(58) Field of Classification Search .................... 29/739, 29/740, 743, 832, 833; 294/64.1, 65; 269/21, 269/903
See application file for complete search history.

(56) References Cited

U.S. PATENT DOCUMENTS

2006/0108045 A1* 5/2006 Nakanishi ....................... 156/60

FOREIGN PATENT DOCUMENTS

JP 2004-148436 * 5/2004

* cited by examiner

*Primary Examiner* — Derris H Banks
*Assistant Examiner* — Jeffrey Carley
(74) *Attorney, Agent, or Firm* — Pearne & Gordon LLP

(57) ABSTRACT

A connection device for an electric component 4 is constituted by two units 2 and 3, height position change means that changes the height position of one end 4a of the electric component 4 relative to the other end 4b is provided for a second unit 3, and the size and weight of a first unit 2 that connects the electric component 4 to a wiring board can be reduced. Therefore, the electric component 4 can be connected, under a low load, to a limited connection region of a wiring board.

9 Claims, 10 Drawing Sheets

CONNECTION DEVICE FOR ELECTRIC COMPONENTS

BACKGROUND OF THE INVENTION

The present invention relates to a device for connecting an electric component, such as a flexible board, that partially includes, at the least, a flexible region.

Since for a flexible board flexibility provides a great degree of freedom for changes in shapes, flexible boards are widely employed as connection means for electrically connecting wiring boards, liquid crystal display panels, camera modules, etc., in equipment for which the body sizes are limited. Both ends of a flexible board serve as connection regions, and connection terminal arrays are formed on these ends. Therefore, for a case wherein a flexible board is to be connected to a wiring board, etc., deformation of the flexible board is corrected using an electric component connection device, which includes a first holding portion (a thermo-compression bonding head that is normally used for both suction and heating) for holding one of the connection regions that are to be connected and a second holding portion for holding the other connection region. In this manner, a terminal array formed on one of the connection regions can be very accurately connected to a wiring board, etc., that is a connection target (see patent document 1).

[Patent Document 1] JP-A-2004-148436

According to the device described in patent document 1, a drive system that changes vertically, relative to one connection region that is to be connected, a height for the other connection region, is provided for the second holding portion, and the shape of the flexible board can be changed. The first holding portion and the second holding portion, which together serve as a conveying head for transporting the flexible board with being held, hold the flexible board that is stored on a tray, convey it to the wiring board for connection, and perform alignment. Therefore, since the drive system is provided for the second holding portion, not only the size of the conveying head, but its weight is increased, and it is especially difficult to cope with a case wherein bonding under a low load is required. Furthermore, for the device, since it can not be assumed that a connection operation will be performed in the vicinity of a limited connection region of a wiring board having a high packaging density, etc., the device is not an appropriate one for the connection of a flexible board to a wiring board on which electric components are mounted.

SUMMARY OF THE INVENTION

Thus, one objective of the present invention is to provide an electric components connection device that, under a low load, can connect an electric component, such as a flexible board, to a limited connection region of a wiring board on which electric components are mounted at a high density.

According to the present invention, an electric components connection device comprises: a first unit, including a first suction application portion, for holding, through suction, one end of an obverse face of an electric component, which at least partially includes a flexible region and for which relative height positions of the one end and of the other end can be changed, and for pressing a connection terminal array, formed on one end of the reverse face, against a connection terminal array formed on a wiring board, and a second suction application portion, for holding, through suction, at a position higher than one end of the electric component, the other end of the obverse face, so that the connection terminal array of the electric component held through suction by the first suction application portion and the second suction application portion is to be connected to the connection terminal array formed on the wiring board; a second unit, provided separately from the first unit, that includes a first support portion, for supporting the reverse face of the electric component near one end, a second support portion for supporting the reverse face of the electric component near the other end, and first height position change means for changing relative height positions of the first support portion and the second support portion; and second height position change means for changing relative height positions of the first unit and of the second unit, wherein the second unit transfers the supported electric component to the first unit, while maintaining a posture such that the other end is positioned higher than the one end.

Preferably, height positions of the first suction application portion and the second suction application portion are changeable.

Furthermore, a distance between the first suction application portion and the second suction application portion is changeable.

According to the present invention, the electric components connection device is constituted by two units, height position change means that changes the height position of one end of the electric component relative to the other end is provided for the second unit, and the size and weight of the first unit that connects an electric component to a wiring board can be reduced. Therefore, an electric component can be connected, under a low load, to a limited connection region of a wiring board.

DETAILED DESCRIPTION OF THE PREFERRED EMBODIMENTS

One mode of the present invention will be described while referring to drawings.

Figure 1:
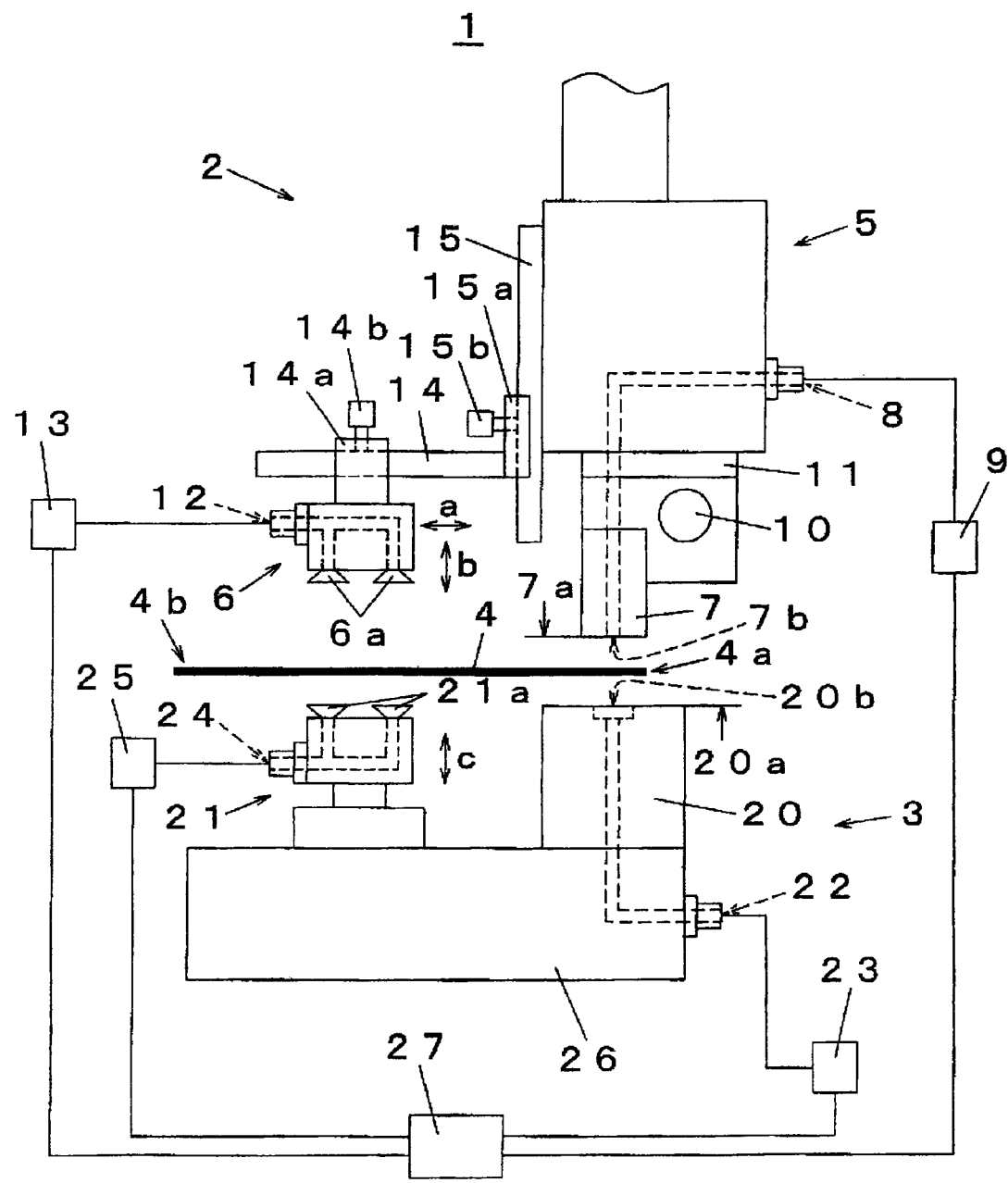
FIG. 1 is a side view illustrating an electric component connection device according to one mode of the present invention.

First, the arrangement of the electric components connection device will be described while referring to FIG. 1. A connection device 1 is constituted by a first unit 2 and a second unit 3 that can ascend or descend independently. The first unit includes: a first suction application portion 5, which applies suction to one end 4a on the obverse-face of a flexible board 4; and a second suction application portion 6, which applies suction to an arbitrary portion at the other end 4b on the obverse face of the flexible board 4. And the first unit holds the flexible board 4 by applying suction to it at two locations, the end 4a and the other end 4b.

A thermo-compression bonding tool 7 is prepared at the lower end of the first suction application portion 5. A suction hole 7b that communicates with a suction hole 8 is opened in a pressure face 7a of the thermo-compression bonding tool 7. The suction hole 8 is connected to a negative pressure generation device 27 via a solenoid valve 9, and when the solenoid valve 9 is opened or closed, the mode is switched between either a suction application mode, for setting for the suction hole 7b a negative pressure, or a non-suction application mode, for releasing the negative pressure and returning to the atmospheric pressure. When the mode is switched to the suction application mode, the end 4a of the obverse face of the flexible board 4, to which suction is applied by the suction hole 7b under the negative pressure, is sucked up to the pressure face 7a. The temperature of the thermo-compression bonding tool 7 is raised by heat transferred from a heater 10, located in the vicinity. The thermo-compression bonding tool 7 and the heater 10 are arranged at a distance from each other, below the first suction application portion 5, using a heat insulation material 11.

Suction pads 6a are provided at the lower end of the second suction application portion 6. The suction pads 6a communicate with a suction hole 12 that is connected to the negative pressure generation device 27 via a solenoid valve 13, and when the solenoid valve 13 is opened or closed, the mode is switched either to a suction application mode, for setting a negative pressure for the suction pads 6a, or a non-suction application mode, for releasing the negative pressure and returning to the atmospheric pressure. When the suction application mode is selected, the other end 4b of the obverse face of the flexible board 4 can be sucked up to the suction pads 6a for which the negative pressure has been set.

The second suction application portion 6 is mounted, via a slider 14a, on a rail 14 that is extended in the horizontal direction. The second suction application portion 6 can be moved in a horizontal direction along the rail 14, and can be fixed at an arbitrary position using a fitting 14b. One end of the rail 14 is attached, via a slider 15a, to a rail 15 that is provided for the first suction application portion 5 and is extended in a vertical direction. The rail 14 can be moved along the rail 15 in the vertical direction, and can be fixed in an arbitrary position using a fitting 15b. Therefore, since the second suction application portion 6 can be horizontally displaced to an arbitrary position along the rail 14 (see arrows a), and can be vertically displaced to an arbitrary position along the rail 15 (see arrows b), the height positioning and the distance relative to the first suction application portion 5 can be changed. Thus, the first unit 2 can hold the other end 4b of the flexible board 4 at an arbitrary position, and can support the flexible board 4 in a posture such that the other end 4b is maintained at a position higher than the end 4a.

The second unit 3 includes: a first support portion 20, which supports the end 4a on the reverse face of the flexible board 4; and a second support portion 21, which supports the other end 4b on the reverse face of the flexible board 4. Thus, the second unit 3 supports the flexible board 4 at two locations, the end 4a and the other end 4b. A suction face 20a is provided on the upper end portion of the first support portion 20, in order to apply suction to the end 4a of the reverse face of the flexible board 4. And a suction hole 20b that communicates with a suction hole 22 is formed in the suction face 20a. The suction hole 22 is connected to the negative pressure generation device 27 via a solenoid valve 23, and when the solenoid valve 23 is opened or closed, the mode can be switched between a suction application mode, for setting the suction hole 20b under a negative pressure, or a non-suction application mode, for releasing the negative pressure and returning to the atmospheric pressure. When the suction application mode is selected, the end 4a of the obverse face of the flexible board 4, which is sucked down to the suction hole 20b, for which the negative pressure was set, can be held, by suction, to the suction face 20a.

Suction pads 21a are provided for the upper end of the second support portion 21. The suction pads 21a communicate with a suction hole 24 that is connected to the negative pressure generation device 27 via a solenoid valve 25, and when the solenoid valve 25 is opened or closed, the mode can be switched between a suction application mode, for setting a negative pressure for the suction pads 21a, or a non-suction application mode, for releasing the negative pressure and returning to the atmospheric pressure. When the suction application mode is selected, the other end 4b of the obverse face of the flexible board 4 can be sucked down to the suction pads 21a for which the negative pressure has been set.

The first support portion 20 and the second support portion 21 are attached to a base portion 26, and the second support portion 21 can be displaced in the vertical direction by a feed screw mechanism, a cylinder mechanism, etc., incorporated in the base portion 26 (see arrows c). Therefore, the second unit 3 can support the flexible board 4 in a posture wherein the other end 4b is positioned higher than the end 4a. The feed screw mechanism constitutes height position changing means for changing the height position of the second support portion 21, relative to the first support portion 20, and is provided for the second unit 3, so that the size and the weight of the first unit 2, which does not need to include height position changing means, such as a feed screw mechanism, can be reduced.

Figure 2A:
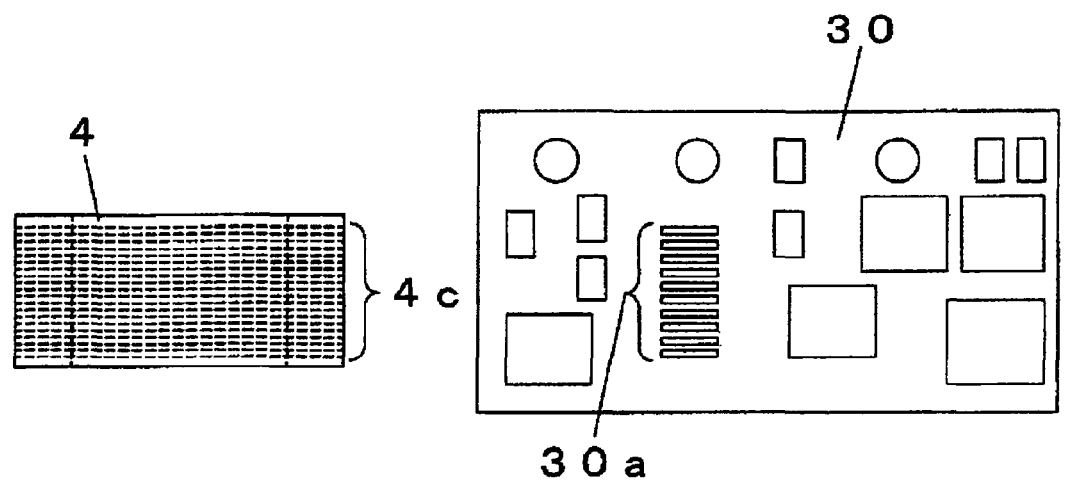
FIGS. 2A and 2B are plan views for explaining a connection of a flexible board to a wiring board.
Figure 2B:
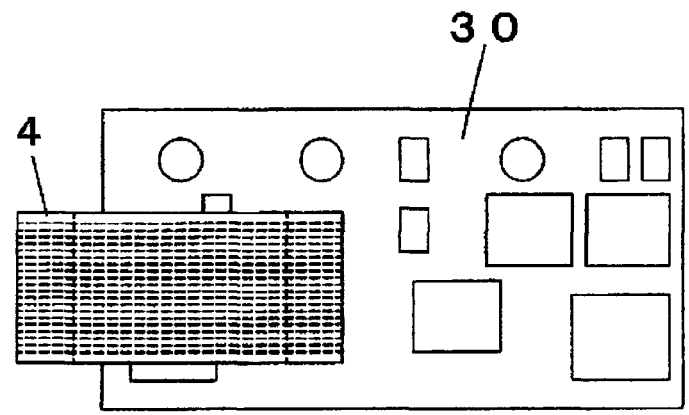

In the thus arranged electric components connection device 1, the flexible board 4 is supported by the second unit 3, from the reverse face, in a posture such that the other end 4b is positioned higher than the end 4a; while this posture is maintained, the flexible board 4 is transferred to the first unit 2, and its obverse face is held by the first unit 2; and then, as shown in FIGS. 2A and 2B, a connection terminal array 4c, formed on the end 4a on the reverse face of the flexible board 4, is connected to a connection terminal array 30a formed on a wiring board 30.

Figure 3:
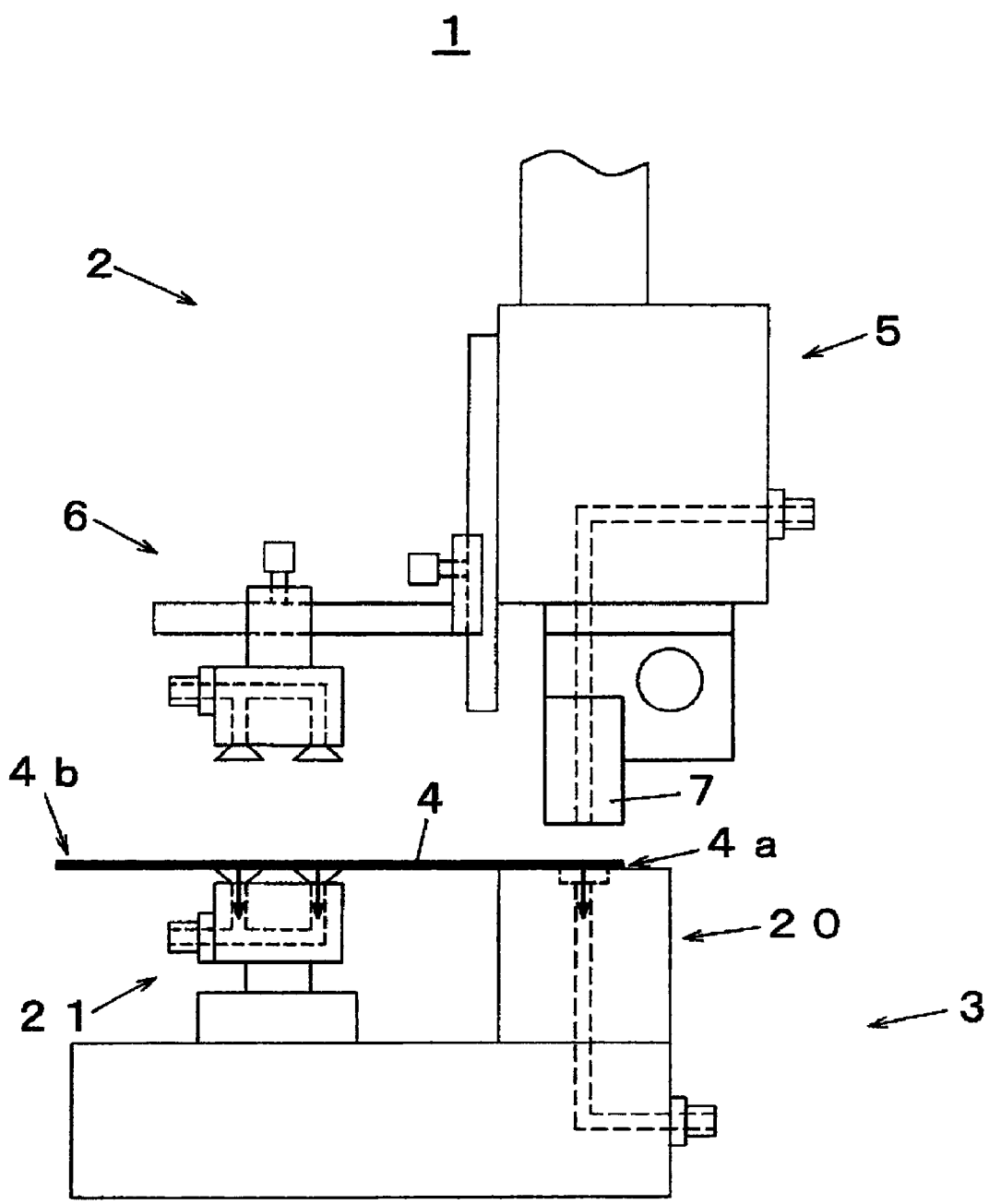
FIG. 3 is a side view for explaining a connection method for the flexible board and the wiring board using the electric components connection device of the mode of the present invention.

A method for connecting the flexible board to the wiring board will now be described. While referring to FIG. 3, the second unit 3 supports the flexible board 4 through the application of suction at two locations on its reverse face, i.e., the first support portion 20 and the second support portion 21. As methods for the application of suction to a flexible board 4 by the second unit 3 in this state, there are a method whereby the second unit 3 applies suction directly to a flexible board 4 that is held in a storage portion, such as a tray, and a method whereby an independent transfer device is employed to transfer a flexible board 4 from a tray to the second unit 3. In a case involving the first method, a mechanism for moving the second unit to a tray and a mechanism for inverting the flexible board 4, setting the board upside down, are required. By employing either method, however, relative height positions of the suction face 20a and the suction pads 21a can be aligned, so that appropriate suction can be applied in a state wherein the flexible board 4 is maintained in a horizontal posture in the tray.

The first unit 2 is positioned above the second unit 3, and the thermo-compression bonding tool 7 faces the first support portion 20 in the vertical direction, while the second suction application portion 6 faces the second support portion 21 in the vertical direction. The height position of the second suction application portion 6 relative to the first suction application portion 5 is adjusted in advance.

Figure 4:
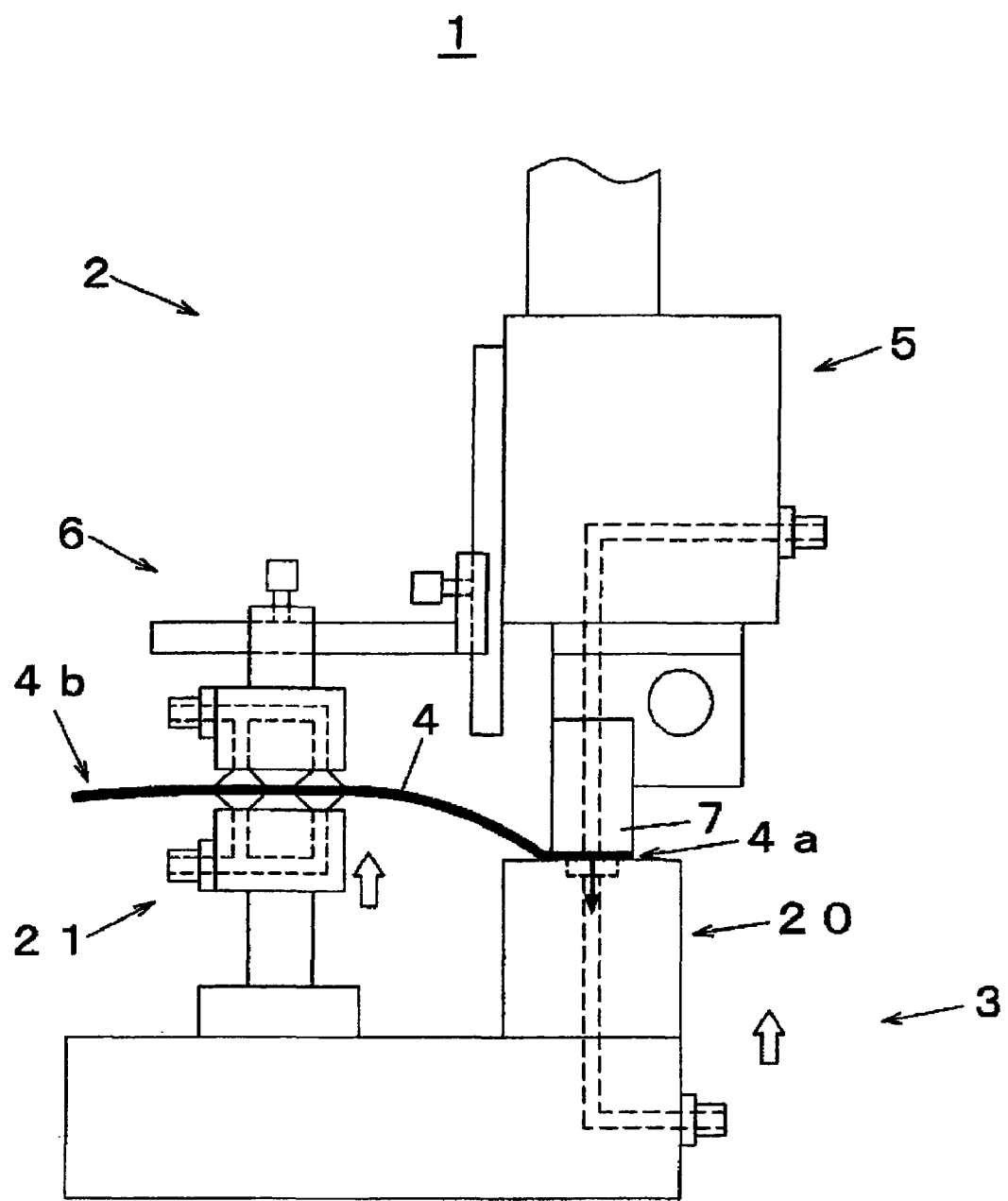
FIG. 4 is a side view for explaining a connection method for the flexible board and the wiring board using the electric components connection device of the mode of the present invention.

While referring to FIG. 4, the second unit 3 is elevated to bring the obverse face of the end 4a of the flexible board 4, which is supported by the first support portion 20, into contact with the thermo-compression bonding tool 7, and the second support portion 21 is elevated from the second unit 3 to bring the obverse face of the other end 4b of the flexible board 4, which is supported by the second support portion 21, into contact with the suction pads 6a of the second suction application portion 6. At this time, the second support portion 21 is changed to the non-suction application mode, and the other end 4b, for which the suction from the reverse face has been released, tends to be horizontally displaced relative to the suction pads 21a as the elevation process is continued. Therefore, the end 4a is not horizontally displaced, separated from the suction face 20a, and a position shift between the two does not occur.

After the end 4a on the obverse face of the flexible board 4 contacts the thermo-compression bonding tool 7, the second unit 3 should continue the elevation process, and the end 4a should be sandwiched between the first support portion 20 and the thermo-compression bonding tool 7, so that displacement of the end 4a can be more effectively suppressed. When the displacement of the end 4a relative to the thermo-compression bonding tool 7 is suppressed, the position of the connection terminal array 4c of the flexible board 4 can be prevented from being greatly shifted away from the pressure face 7a of the thermo-compression bonding tool 7. Further, when the connection terminal array 4c is to be aligned with the connection terminal array 30a formed on the wiring board 30, a positioning correction load imposed on the first unit 2 that holds the flexible board 4 can be reduced, and the positioning accuracy can also be increased.

Figure 5:
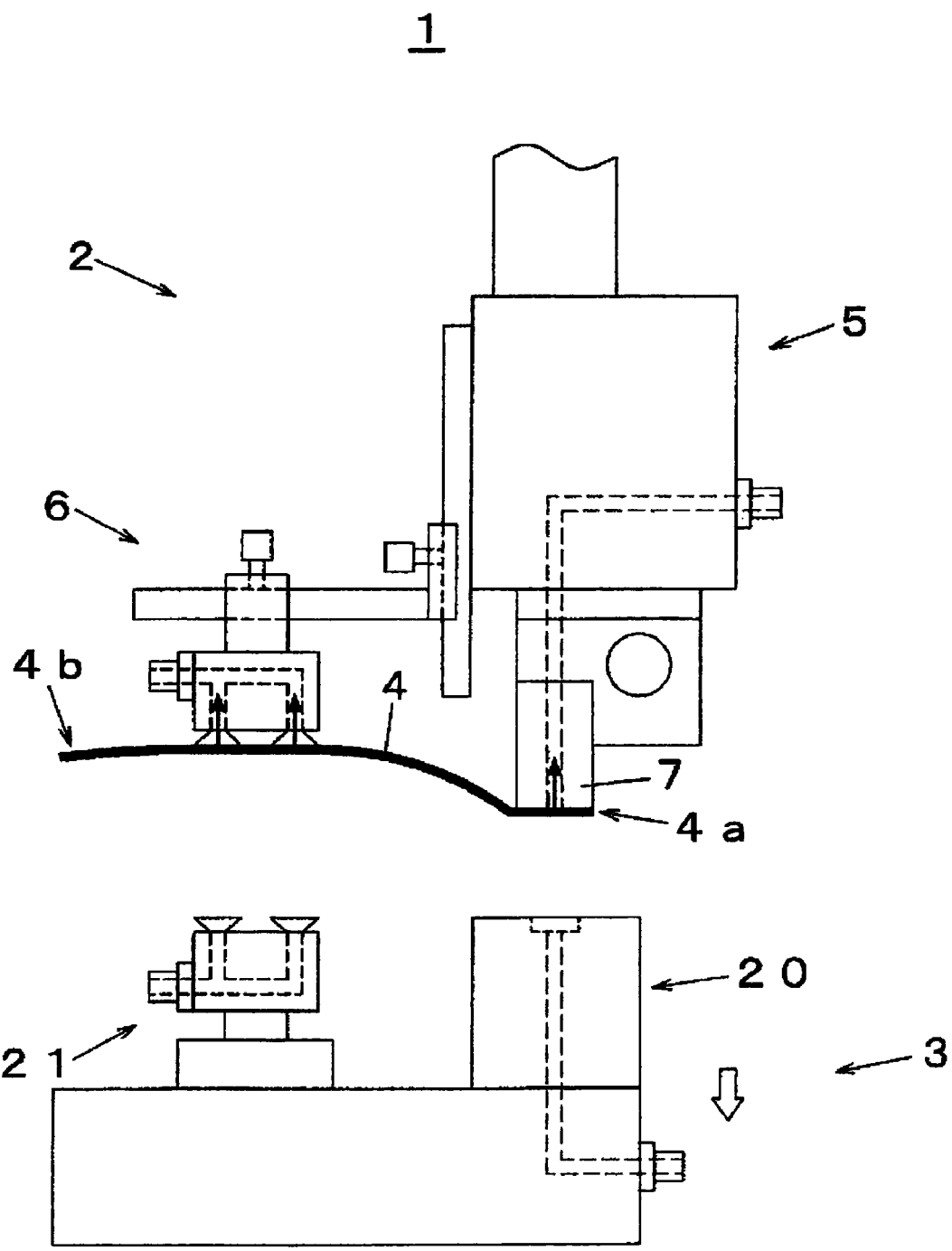
FIG. 5 is a side view for explaining a connection method for the flexible board and the wiring board using the electric components connection device of the mode of the present invention.

While referring to FIG. 5, the first suction application portion 5 and the second suction application portion 6 are changed to the suction application mode, the first support portion 20 and the second support portion 21 are changed to the non-suction application mode, and thereafter, the second unit 3 descends. Thus, the flexible board 4 is transferred on the second unit 3 to the first unit 2. The flexible board 4, after being transferred to the first unit 2, is held in a posture such that the other end 4b is positioned higher than the end 4a, and a state is obtained wherein the end 4a is held by suction to the thermo-compression bonding tool 7, located at the lowermost point of the first unit 2.

Figure 6:
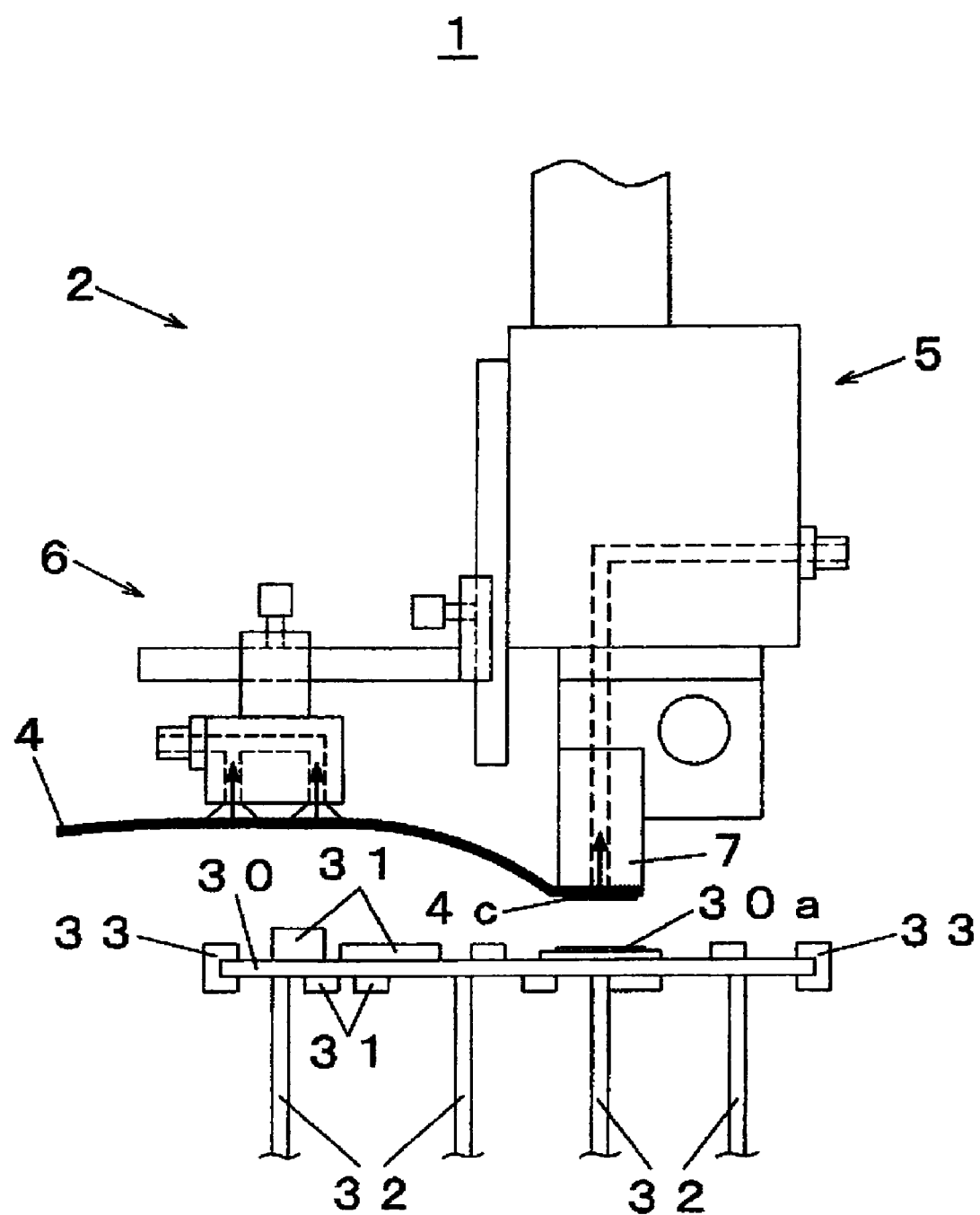
FIG. 6 is a side view for explaining a connection method for the flexible board and the wiring board using the electric components connection device of the mode of the present invention.

While referring to FIG. 6, by moving the first unit 2, the flexible board 4 is conveyed above the wiring board 30 so as to align the connection terminal array 4c with the connection terminal array 30a formed on the wiring board 30. Since the inertial mass is decreased because of a reduction in the size and the weight of the first unit 2, quicker and more accurate aligning is enabled.

Various electric components 31 are mounted in regions, on the obverse face of the wiring board 30, other than the connection region wherein the connection terminal array 30a is formed. Electric components 31 are also mounted across almost the entire reverse face. The wiring board 30 is supported, from the reverse face, by using several support pins 32 arranged at appropriate intervals. The support pins 32 supports the wiring board 30 at locations on the reverse face of the wiring board 30 where no electric components 31 are mounted. Then, when the wiring board 30 is carried in along a conveying rail 33, the support pins 32 are moved down, and after the flexible board 4 has been connected, the support pins 32 are again moved down and retracted, so that they do not interfere with the electric components 31.

Figure 7:
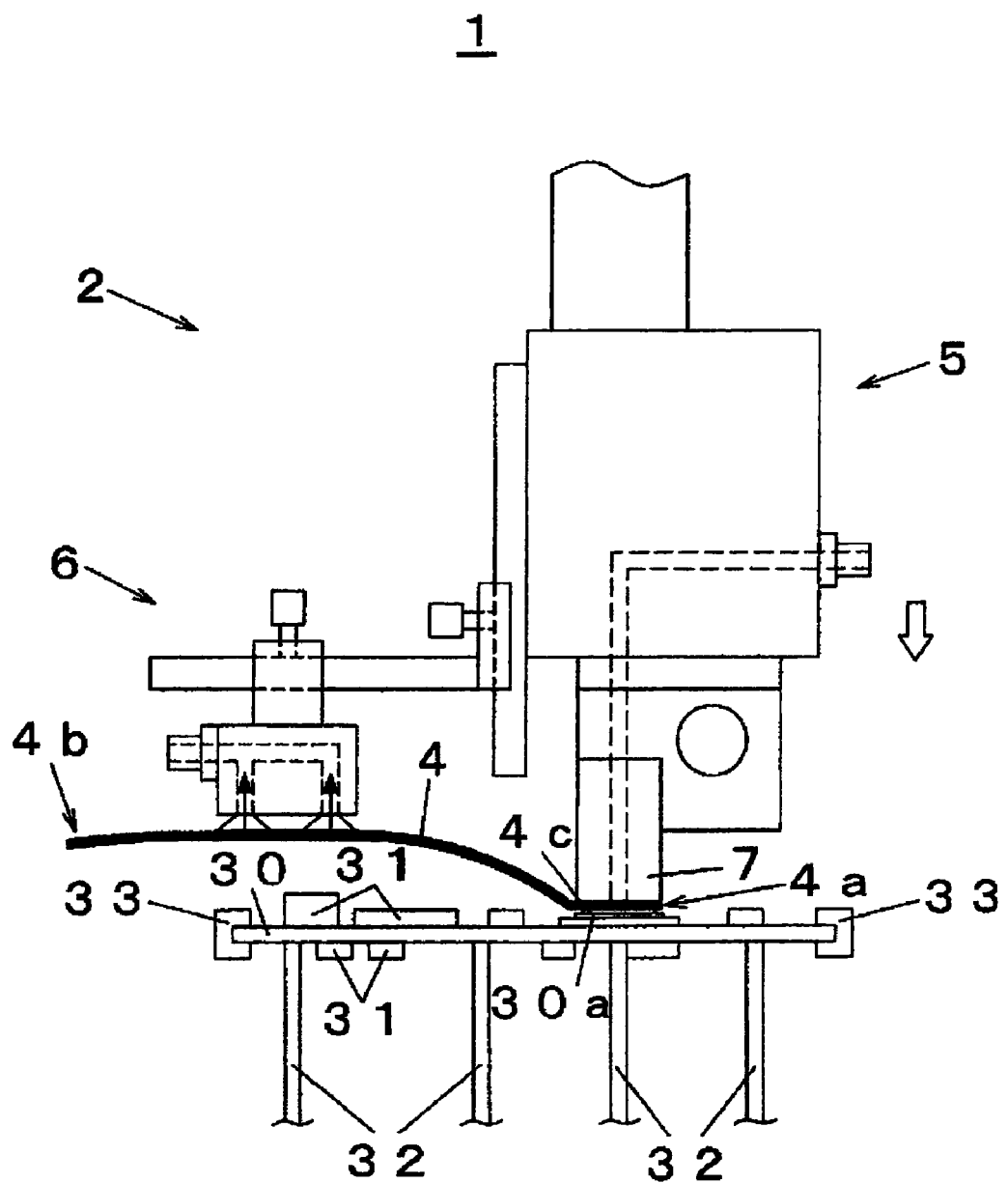
FIG. 7 is a side view for explaining a connection method for the flexible board and the wiring board using the electric components connection device of the mode of the present invention.

While referring to FIG. 7, the first unit 2 is lowered and the thermo-compression bonding tool 7, which has been heated, is employed to press the end 4a against the connection region of the wiring board 30. A thermosetting resin paste throughout which low-heat melting conductors, such as solder grains, are scattered is applied to the connection region of the wiring board 30. Thus, while solder grains are melted, the curing of the thermosetting resin is advanced by heating, and the end 4a of the flexible board 4 and the connection region of the wiring board 30 are adhered together by the thermosetting resin that has been cured, while the connection terminal array 4c and the connection terminal array 30a are bonded together by the melted solder grains. Therefore, the connection terminal array 30a formed on the wiring board 30 is electrically connected to the connection terminal array 4c formed on the end 4a of the flexible board 4, and because of the adhesive strength of the thermosetting resin, connection reliability is ensured.

Since the flexible board 4 is in a state wherein the end 4a is sucked up to the thermo-compression bonding tool 7 located at the lowermost portion of the first unit 2, at the time of connection, only the end 4a contacts the wiring board 30, and the other end 4b is at a distance from the wiring board 30. Therefore, the flexible board 4 can be connected to the wiring board 30 without interfering with the electric components 31 that have already been mounted. Furthermore, the wiring board 30 must be supported from below at the time of the connection because the thermo-compression bonding tool 7 presses down on the connection region of the wiring board 30; however, since the thermo-compression bonding tool 7 merely imposes a load sufficient for compressing and melting low-heat melting solder grains between the connection terminal array 4c and the connection terminal array 30a, several appropriately located support pins 32 are sufficient for holding the load, without excessive deformation of the wiring board 30 occurring. Furthermore, since the size and weight are reduced for the first unit 2 whereat the thermo-compression bonding tool 7 is located, the first unit 2 is an appropriate device for performing low-load bonding that will not impose excessive pressure on the support pins 32, or for performing an operation in the vicinity to the limited connection region of the wiring board 30. Therefore, so long as, at the least, a connection region at the end 4a of the flexible board 4 is obtained for the wiring board 30, the connection to the flexible board 4 can be performed, even in a case wherein the electric components 31 are mounted at a high density across the entire area, including the region corresponding to the reverse face of the connection region.

Figure 8:
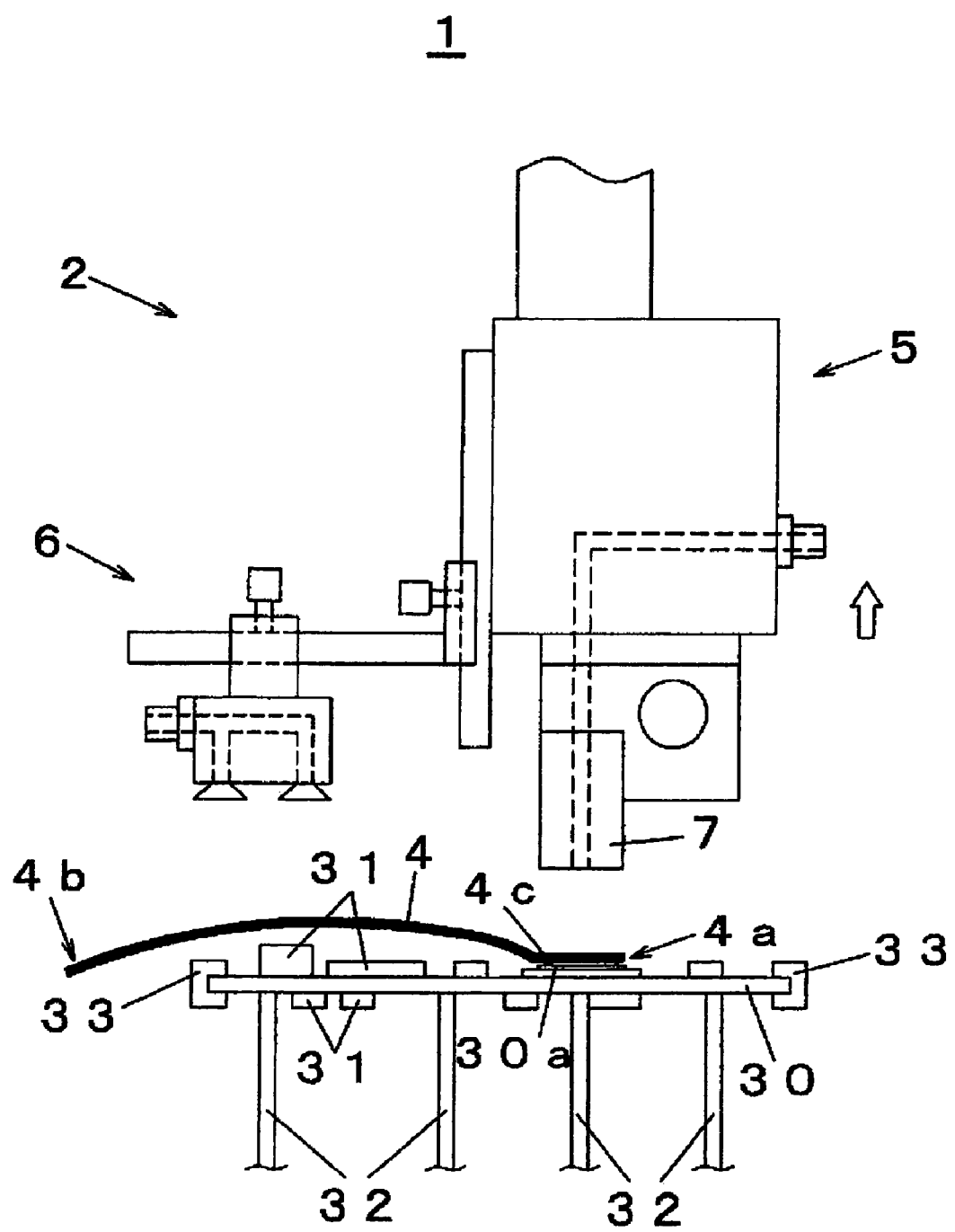
FIG. 8 is a side view for explaining a connection method for the flexible board and the wiring board using the electric components connection device of the mode of the present invention.

While referring to FIG. 8, when connection of the wiring board 30 and the flexible board 4 has been completed, the first suction application portion 5 and the second suction application portion 6 are changed to the non-suction application mode to elevate the first unit 2. The wiring board 30 to which the flexible board 4 is connected is carried out, and an unconnected wiring board is carried in. The first unit 2 receives a new flexible board from the second unit 3, and connects the flexible board to the unconnected wiring board.

In this mode, the first unit 2 and the second unit 3 are independently elevated and lowered by height position change means that changes the relative height positions of the first unit and the second unit; however, either one unit may be elevated or lowered to move the units near each other or to separate them. Furthermore, the flexible board 4 is flexible as a whole; however, an electric component that, at the least, partially includes a flexible region and can change the relative height positions of one end and the other end can also be connected to the wiring board 30.

Figure 9A:
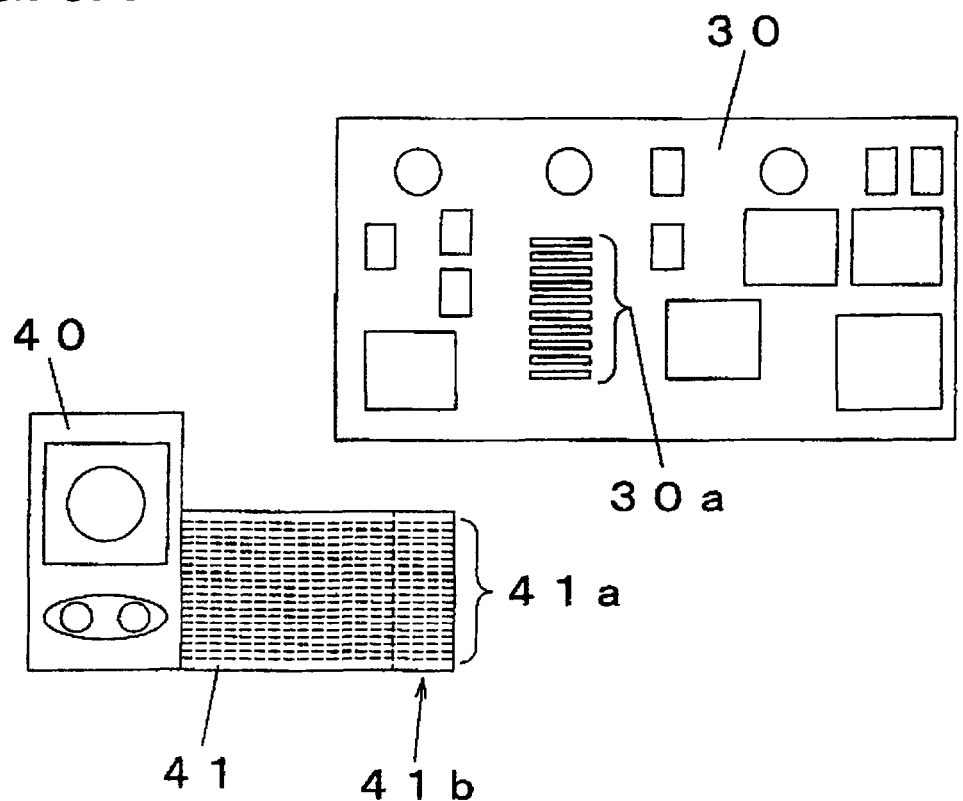
FIGS. 9A and 9B are plan views for explaining a connection of a camera module to a wiring board.
Figure 9B:
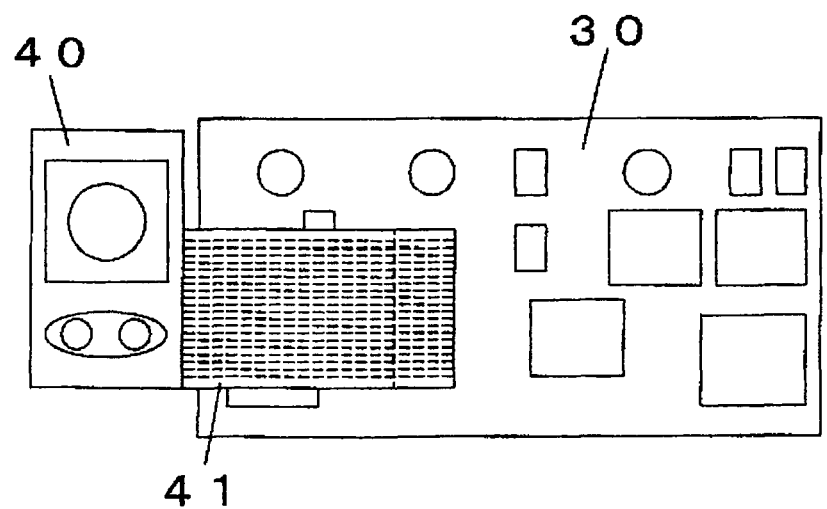
Figure 10:
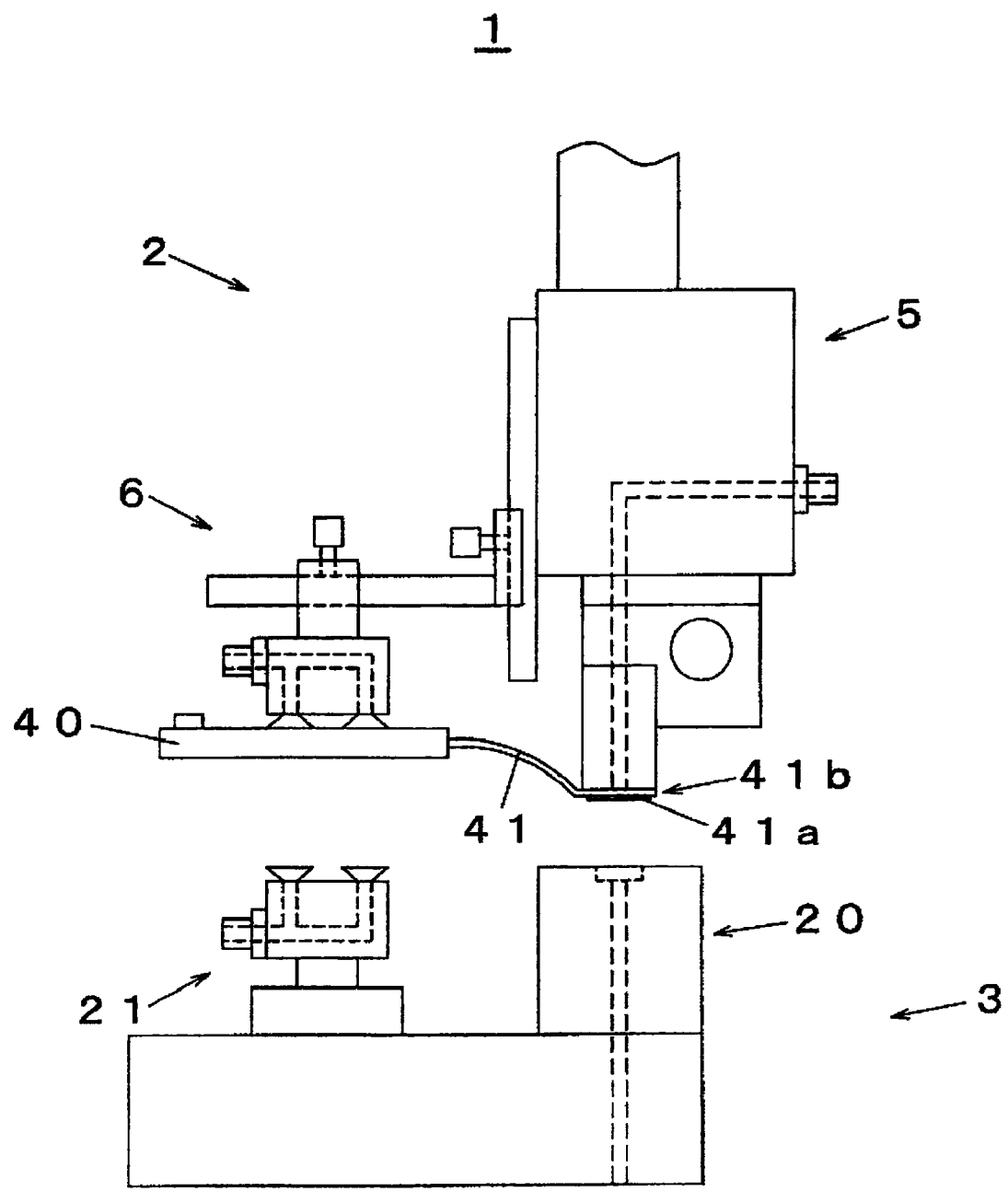
FIG. 10 is a side view for explaining a connection method for the camera module and the wiring board using the electric components connection device of the mode of the present invention.

For example, in a case for an electric component shown in FIG. 9, wherein flexible wires 41 are connected in advance to a camera module 40, as shown in FIG. 10, one end 41*b* at which a connection terminal array 41*a* of the wires 41 is formed is transferred from the first support portion 20 to the first suction application portion 5, and the camera module 40 is transferred from the second support portion 21 to the second suction application portion 6. As a result, the electric component is transferred from the second unit 3 to the first unit 2.

According to the present invention, the electric components connection device is constituted by the two units, the height position change means that changes the height position of one end of the electric component relative to the other end is provided for the second unit, and the size and weight of the first unit that connects an electric component to a wiring board can be reduced. Therefore, the present invention provides, as advantages, the fact that an electric component can be connected, under a low load, to a limited connection region of a wiring board, and in the industrial field is useful for connecting, to a wiring board on which electric components are mounted at a high density, an electric component like a flexible board, which, at the least, partially includes a flexible region, and for which relative height positions of one end and the other can be changed.

What is claimed is:

1. An electric components connection device comprising:
   a first unit, including
      a first suction application portion, for holding, through suction, one end of an obverse face of an electric component, which at least partially includes a flexible region and for which relative height positions of the one end and of the other end can be changed, and for pressing a connection terminal array, formed on one end of the reverse face, against a connection terminal array formed on a wiring board, and
      a second suction application portion, for holding, through suction, at a position higher than one end of the electric component, the other end of the obverse face, so that the connection terminal array of the electric component held through suction by the first suction application portion and the second suction application portion is to be connected to the connection terminal array formed on the wiring board; and
   a second unit, provided separately from the first unit, including
      a first support portion, for supporting one end of the reverse face of the electric component, and
      a second support portion for supporting the other end of the reverse face of the electric component,
      wherein relative height positions of the first support portion and the second support portion are changeable, and
   wherein the second unit transfers the supported electric component to the first unit, while maintaining a posture such that the other end of the electric component is positioned higher than the one end of the electric component,
   wherein a distance between the first support portion and the second support portion is less than a length of the electric component so that the electric component is supported by both the first support portion and the second support portion simultaneously at the posture,
   wherein the first support portion and the second support portion support the reverse face of the electric component at two different locations.

2. An electric components connection device according to claim 1, wherein height positions of the first suction application portion and the second suction application portion are changeable.

3. An electric components connection device according to claim 1, wherein a distance between the first suction application portion and the second suction application portion is changeable.

4. An electric components connection device according to claim 2, wherein a distance between the first suction application portion and the second suction application portion is changeable.

5. An electric components connection device according to claim 1, further comprising a base portion, wherein the base portion is integrally attached to both the first support portion and the second support portion.

6. An electric components connection device according to claim 1, further comprising a height change means for changing relative height positions of the first support portion and the second support portion.

7. An electric components connection device according to claim 1, wherein the first support portion and the second support portion are in contact with the reverse face of the electric component at two different locations when supporting the reverse face of the electric component.

8. An electric components connection device according to claim 1, wherein the first suction application portion is faced to the first support portion and the second suction application portion is faced to the second support portion.

9. An electric components connection device according to claim 1, wherein at least one of the first support portion and the second support portion comprises suction means for applying suction to the reverse face of the electric component.

* * * * *